United States Patent
Kumpula et al.

(10) Patent No.: US 10,129,058 B2
(45) Date of Patent: Nov. 13, 2018

(54) DEMODULATION REFERENCE SIGNAL BASED AUTOMATIC GAIN CONTROL

(71) Applicant: Nokia Solutions and Networks Oy, Espoo (FI)

(72) Inventors: Mikko Kumpula, Oulu (FI); Olga Kayo, Oulu (FI)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 15/267,806

(22) Filed: Sep. 16, 2016

(65) Prior Publication Data

US 2018/0083811 A1    Mar. 22, 2018

(51) Int. Cl.
  *H04L 27/01* (2006.01)
  *H04L 27/26* (2006.01)
  *H04L 25/02* (2006.01)
  *H04L 25/03* (2006.01)
  *H03G 3/20* (2006.01)

(52) U.S. Cl.
  CPC .......... *H04L 27/01* (2013.01); *H04L 25/0228* (2013.01); *H04L 25/03159* (2013.01); *H04L 27/2653* (2013.01); *H03G 3/20* (2013.01)

(58) Field of Classification Search
  CPC ....... H04L 2025/03426; H04L 25/0202; H04L 25/0212; H04L 25/022; H04L 27/2647; H04L 25/0228; H04L 25/03949; H04L 27/01
  USPC .................................. 375/219, 260; 370/252
  See application file for complete search history.

(56) References Cited

U.S. PATENT DOCUMENTS

| 2007/0189406 A1* | 8/2007 | Kim ..................... H04L 27/2613 375/260 |
| 2007/0230635 A1 | 10/2007 | Wilhelmsson et al. |
| 2008/0056394 A1* | 3/2008 | Lee ...................... H03G 3/3078 375/260 |
| 2008/0075179 A1* | 3/2008 | Li ...................... H04L 25/03038 375/260 |
| 2009/0086806 A1* | 4/2009 | Hwang ............. H04L 25/03006 375/232 |
| 2009/0296833 A1* | 12/2009 | Sawahashi ............ H04L 1/0007 375/260 |

(Continued)

FOREIGN PATENT DOCUMENTS

| EP | 1826971 A1 | 8/2007 |
| EP | 2192735 A1 | 6/2010 |
| WO | WO 2007078096 A1 | 7/2007 |

*Primary Examiner* — Leila Malek
(74) *Attorney, Agent, or Firm* — Harrington & Smith (57) ABSTRACT

When processing a signal received wirelessly a gain is applied to a reference signal and the wireless channel over which a received signal passed is estimated using the reference signal with the applied gain. Equalization values obtained from the estimating are adjusted to remove effects of the applied gain. Those adjusted equalization values are then used to equalize at least a data portion of the received signal. The results are stored in a computer readable memory, such as a buffer of a decoder also within the same receiver. Embodiments describe the received signal can be a subframe in which the reference signal is a DMRS or similar that occupies an entire symbol position thereof, as well as a single symbol in which the reference signal is a pilot sequence or pilot samples and the data portion is also within that same single symbol.

17 Claims, 7 Drawing Sheets

(56) References Cited

U.S. PATENT DOCUMENTS

2014/0293900 A1* 10/2014 Takeda ................. H04L 5/0073
370/329

* cited by examiner

DEMODULATION REFERENCE SIGNAL BASED AUTOMATIC GAIN CONTROL

TECHNOLOGICAL FIELD

The described invention relates to signal processing for digital communications, and more particularly to gain control for processing received signals such as wireless data with reference signals.

BACKGROUND

In electronic or optical telecommunications, particularly wireless, the received signal is generally different than the transmitted signal due to distortion introduced by the transmission channel. The receiver can ideally retrieve the original transmitted signal by estimating the channel and then applying the estimate to the received signal. It follows that accurate channel estimation plays key role in successful data reception.

The power level of the received signal depends on the power used to transmit that same signal and the distance it traversed over the communication channel, and the received power can vary greatly from the transmitted power. For a MIMO receiver with multiple receive antennas which is becoming increasingly common, the signal received at different MIMO antennas may be received with different power levels. The receiver must be able to operate across the full signal range of course, which brings an added challenge to receiver design. This challenge continues in wireless radio access technologies still in the development stage such as 5G cellular high data rate transmissions.

When implementing a signal processing algorithm in a receiver, one part of the design work is to choose suitable lengths of digital words that are used internally within the receiver for the algorithm's calculations. Word lengths are generally chosen so that the complete calculation chain as a whole fulfils the performance requirements the receiver needs to meet for a given radio access technology. But it is desirable to minimize the word lengths to achieve minimum hardware costs. Throughout the receiver processing chain some sub-blocks will be more sensitive to the signal power level than others, and this sensitivity is at least in part built into the hardware due to the word length limits imposed when designing the receiver. For example, a receiver designed for a maximum word length of N bits typically will have its buffers (hardware) able to hold no more than N bits at once, so if a FFT operation needs to operate on N+7 bits to meet the minimum performance requirements due to the signal power being very low it may simply not be possible due to hardware constraints in the receiver.

Since the hardware calculation blocks in a receiver are designed to meet the performance requirements under the assumption of a specified range of signal power, that same receiver can be expected to perform relatively poorly when the signal level is significantly lower. This is because intermediate results from the power-sensitive sub-blocks become too inaccurate and these inaccuracies propagate through the remainder of the receiver processing chain. In short, the data reception processing may work well for a certain signal level but the receiver's performance often drops dramatically when the received signal level turns low. Embodiments of these teachings address this issue from the pelipective of the receiver design.

SUMMARY

According to a first aspect of these teachings there is a method comprising: applying a gain to a reference signal; estimating a wireless channel, over which a received signal passed, using the reference signal with the applied gain; adjusting equalization values obtained from the estimating to remove effects of the applied gain; and equalizing at least a data portion of the received signal using the adjusted equalization values and storing the result in a computer readable memory.

According to a second aspect of these teachings there is an apparatus comprising a splitter, a gain control circuit, a channel estimating circuit, an equalization values calculation circuit, a cancellation circuit and an equalizer. In this regard the splitter is configured to split a received signal into a first portion comprising a reference signal and a data portion. The gain control circuit is configured to apply a gain to the reference signal. The channel estimating circuit is configured to estimate a wireless channel, over which the received signal passed, using the reference signal with the applied gain. The equalization values calculation circuit is configured to calculate equalization values from the estimated wireless channel. And the cancellation circuit is configured to adjust the calculated equalization values output from the equalization values calculation circuit so as to remove effects of the applied gain.

According to a third aspect of these teachings there is a computer readable memory storing computer program instructions that, when executed by one or more processors, cause a radio receiver to at least apply a gain to a reference signal; estimate a wireless channel, over which a received signal passed, using the reference signal with the applied gain; adjust equalization values obtained from the estimated wireless channel so as to remove effects of the applied gain; and equalize a data portion of the received signal using the adjusted equalization values.

These and other aspects are detailed below with particularity.

DETAILED DESCRIPTION

Consider a wireless communication system that has a base station such as an eNB or access point on the network side and a mobile terminal/smartphone/user equipment (UE) on the user side. Modern wireless communication systems can vary greatly from this basic model, such as additional relay nodes on the network side, device-to-device D2D UEs communicating directly with one another and the like. But in all cases each entity having a wireless link with another has a radio receiver. In that regard embodiments of these teachings can be deployed in all of these entities, or in only some of them since the processing of the received signal as described more fully below is not conditional on the entity sending the wireless data performing some pre-transmission processing so as to make the transmitted signal compatible with such a receiver.

Figure 1:
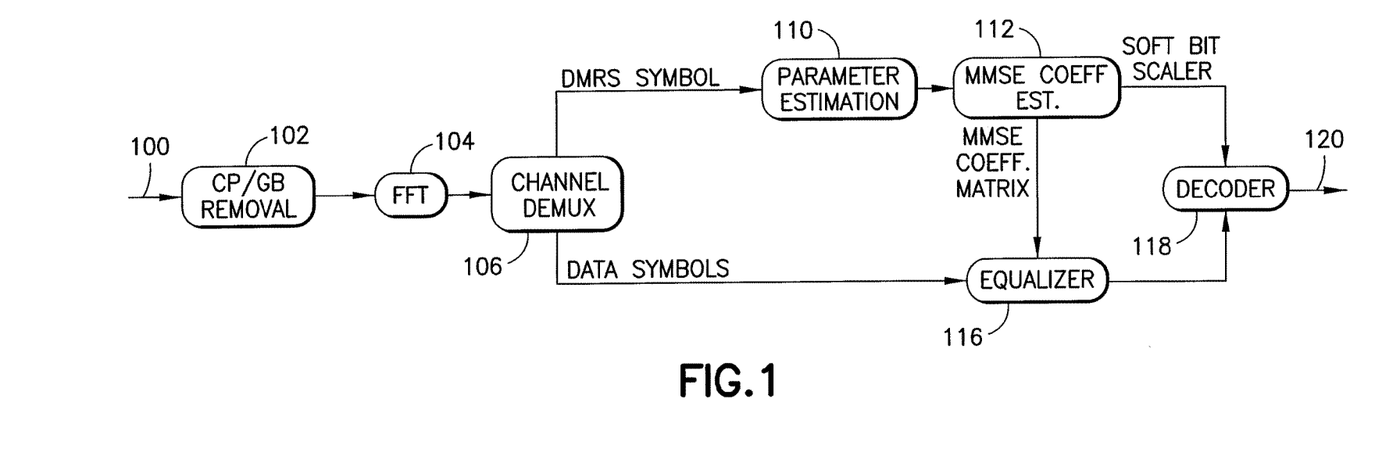
FIG. 1 is a schematic diagram illustrating an example MMSE radio receiver for OFDMA according to the prior art.

FIG. 1 is a schematic diagram showing some of the major processing sub-blocks of a minimum mean square error (MMSE) receiver. The MMSE receiver is suitable for processing multiple-input multiple-output (MIMO) signals that are transmitted on multiple correlated channels. MIMO communication techniques facilitate high data rates and are used in some current radio access technologies (for example, Long Term Evolution LTE and newer iterations of WiFi/IEEE 802.xx) as well as in some that are under development (for example, 5G).

Figure 5:
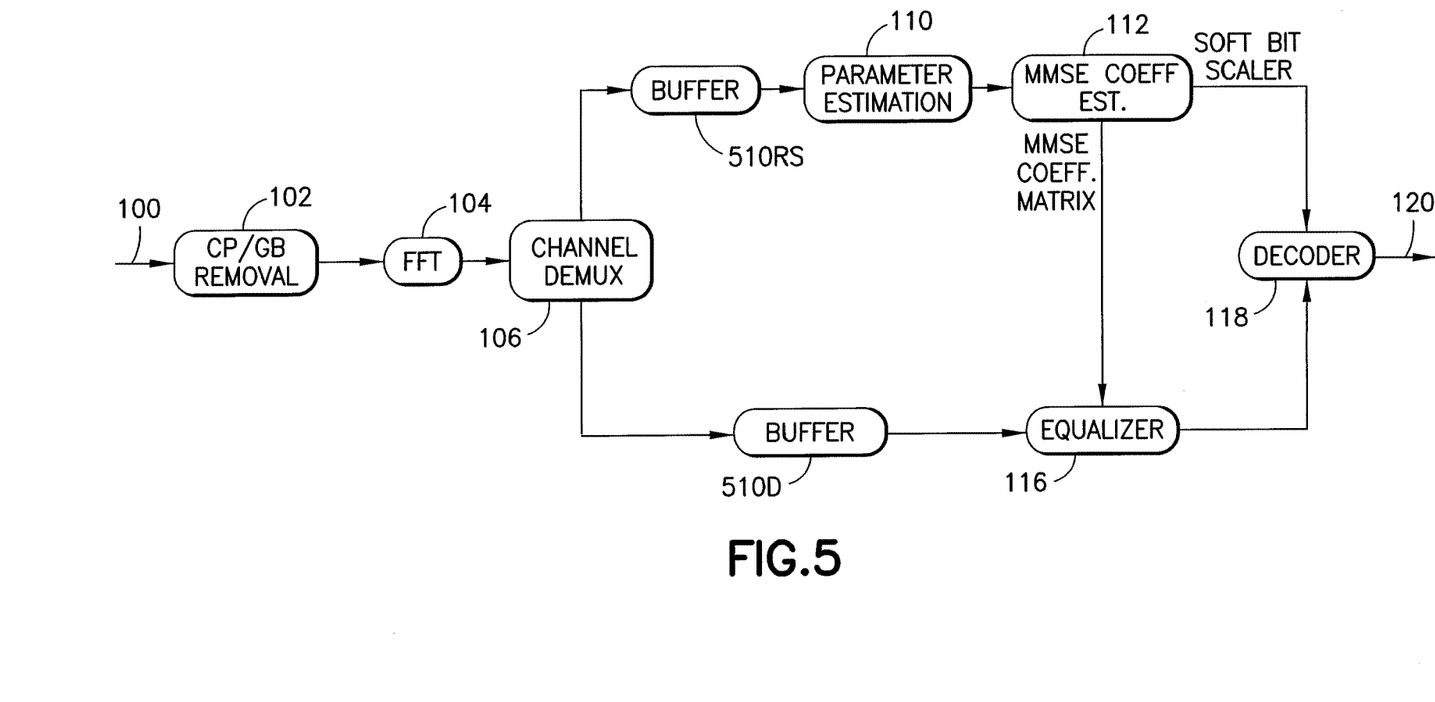
FIG. 5 illustrates a MMSE receiver similar to FIG. 1 but with buffers following the channel demultiplexing.
Figure 6:
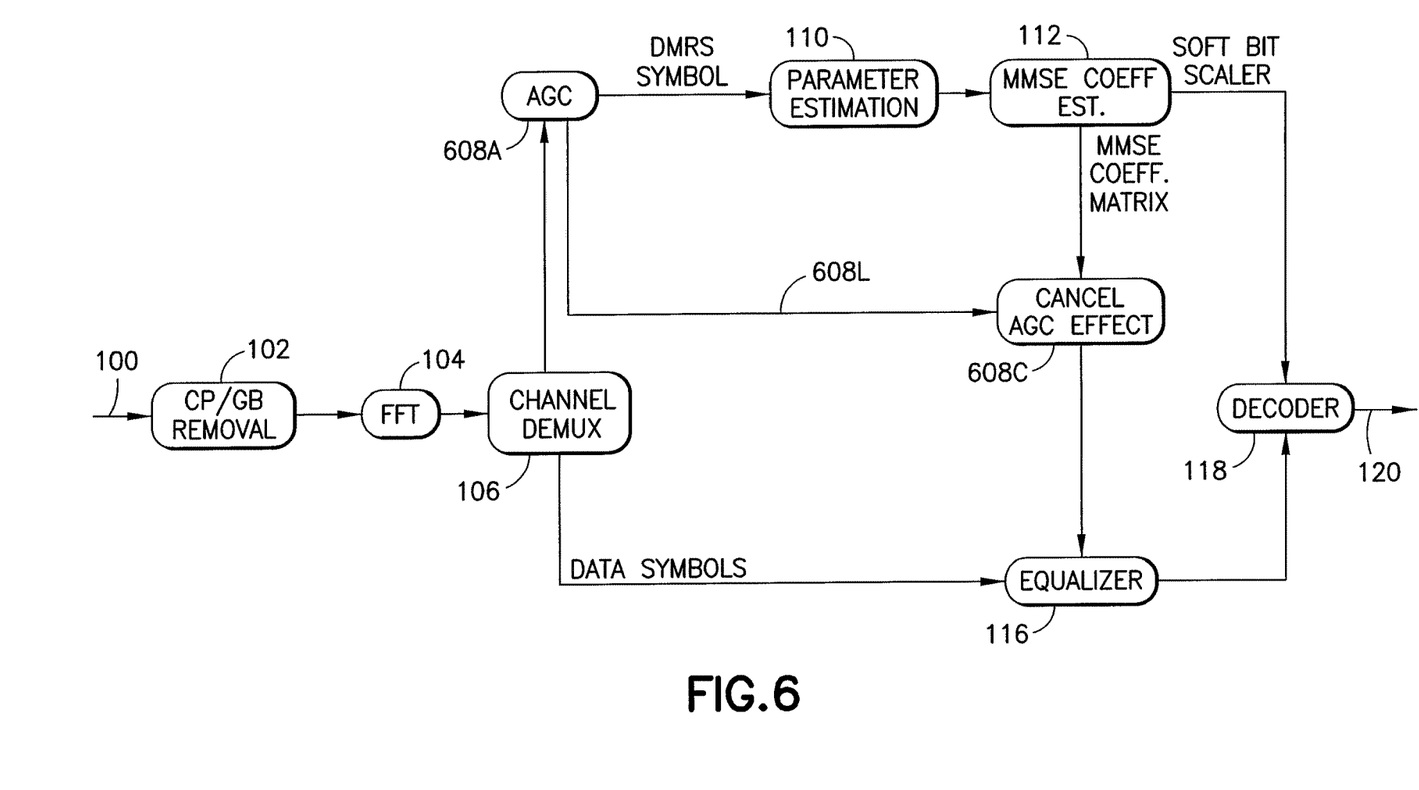
FIG. 6 is a receiver similar to FIG. 5 but with automatic gain control according to one non-limiting embodiment of these teachings.
Figure 7:
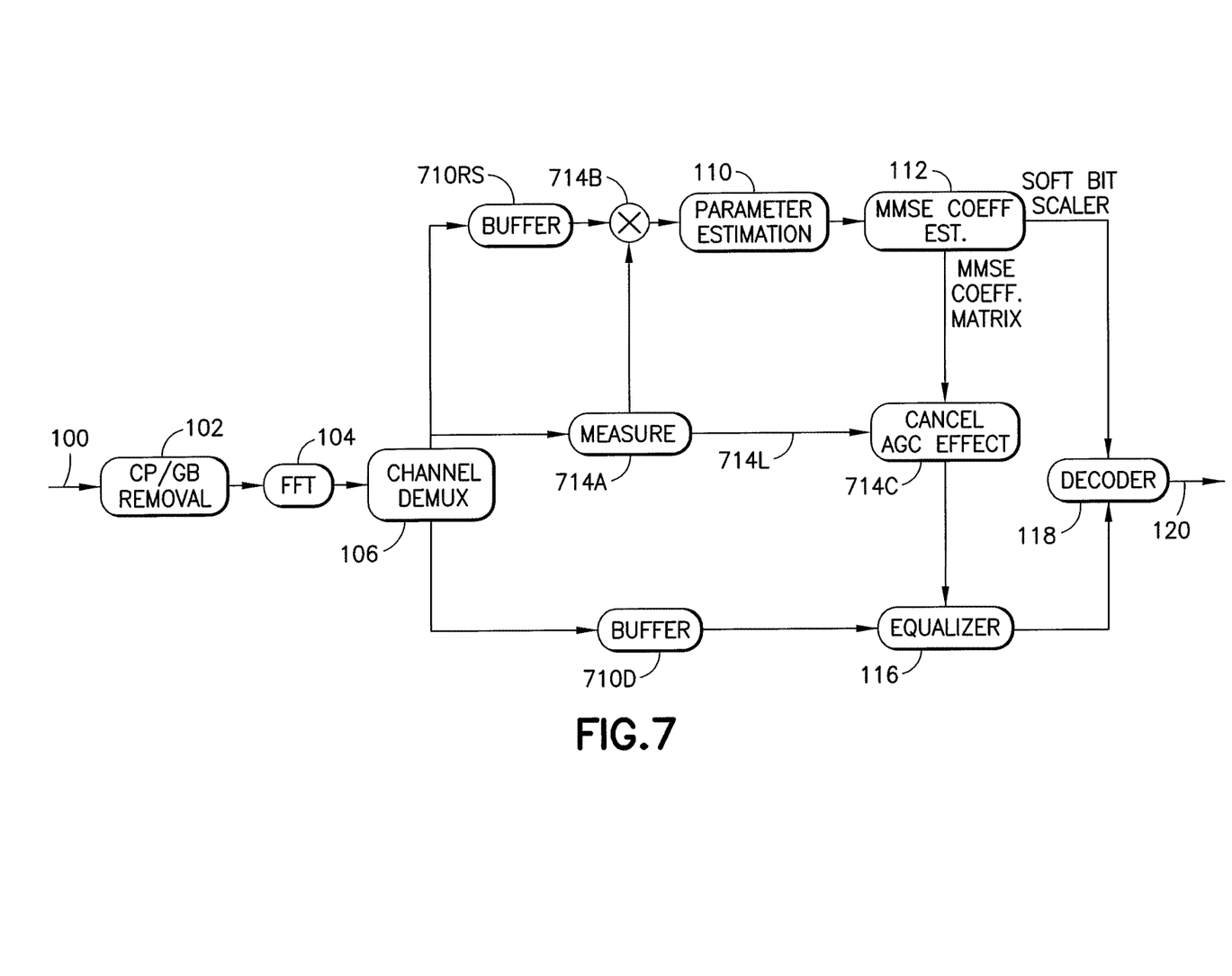
FIG. 7 is similar to FIG. 6 but illustrating automatic gain control according to another non-limiting embodiment of these teachings.

FIGS. 5-7 illustrate various aspects of the invention in the context of a MMSE receiver so the reader can better recognize certain key differences over the prior art FIG. 1 MMSE receiver. These drawings and the specific examples presented below do not imply that these teachings are limited only to MMSE type receivers. As will be evident from the non-limiting examples below certain aspects of these teachings can be deployed in any receiver that performs both estimation of channel parameters and equalization of the received signal. Apart from MMSE, zero-forcing receivers and receivers that use non-linear equalization techniques (such as decision-feedback successive interference cancellation SIC) are other non-limiting examples of receiver types in which these teachings may be deployed to advantage.

Returning to the MMSE receiver of FIG. 1, the received signal is input at 100 and the CP/GP removal processing block 102 strips out the cyclic prefix CP and/or the guard period GP. The fast Fourier transform (FFT) block 104 performs a FFT on the signal output from the CP/GP removal processing block 102, converting it between the time and frequency domains. This transform block 104 can alternatively operate by performing a Discrete Fourier transform (DFT) but it is typical for wireless receivers to use the FFT which yields the same result but faster and often with greater accuracy than a DFT. At the channel demultiplexing (demux) block 106 the output of the FFT block is channel-demultiplexed and divided into data symbols and reference symbols which are separately output as shown.

FIG. 1 shows these reference symbols as demodulation reference symbols (DMRS) but these teachings can be utilized with various other reference signals disposed at known locations of a subframe or of the received signal in general. Additionally, the other output of the channel demultiplexing block 106 is shown in FIG. 1 as "data symbols" for brevity but in fact there may also be control information mixed with user data in this output stream, all of which will be similarly decoded by the receiver as further detailed. Note that the MMSE receiver of FIG. 1 is simplified and in practice the channel demultiplexer 106 may have further output ports beyond the two that are shown, for example to output the control information. So for example if the output for the data symbols is referred to as the uplink shared channel port there may be a parallel but un-illustrated port referred to as the uplink control channel port that outputs control information that is processed slightly differently than shown in FIG. 1 for the data symbols.

As will be seen, it is the treatment of the DMRS that is the greater focus of the description below. In the conventional MMSE receiver that FIG. 1 represents the DMRS output from the channel demux block 106 is evaluated by the parameter estimation block 110 to estimate certain parameters that define the channel between the transmitter which sent the signal wirelessly and the receiver of FIG. 1. From the values for the channel parameters that are output from the parameter estimation block 110 the MMSE coefficient estimator block 112 finds the specific equalization coefficients to apply to a signal received over the channel those parameter values reflect. The equalization coefficients in this example are MMSE coefficients since FIG. 1 represents a MMSE receiver. In a MIMO system there are multiple channels per received signal and so the parameter estimation block 110 estimates parameters for multiple channels and the MMSE coefficient estimator block 112 finds equalization coefficients to equalize the signal that was received over all of them. The MMSE coefficient estimator block 112 outputs to the equalizer 116 a matrix of MMSE coefficients that reflects these multiple correlated channels, and it also outputs to the decoder 118 soft bit scalers which are layer-wise signal to noise ratio (SNR) values that estimate each layer.

The equalizer block 116 applies the equalization coefficients, which in this case is the MMSE coefficient matrix it gets from the MMSE coefficient estimator block 112, to the data symbols (which may also have control information/symbols) it gets from the channel demuliplexing block 106, and outputs the result to the decoder block 118. The decoder block 118 uses the soft bit scaler/layer-wise SNR values that it gets from the MMSE coefficient estimator block 112 when decoding the equalized signal that it gets from the equalizer block 116 and outputs 120 the decoded signal.

Because the problem outlined in the background section above is caused by intermediate calculation results from certain of the intermediate sub-blocks of FIG. 1 that are too inaccurate, it can be solved by improving the accuracy of the hardware blocks that are more sensitive to signal power level. This can be done by simply increasing word lengths when designing the receiver, but this increased gate count directly increases the cost of the integrated circuits that implement these sub-blocks. Particularly in MMSE receivers for MIMO processing several of the hardware blocks are power level sensitive and a significant increase in accuracy would be needed to deal with very low power signals in a manner that would meet the 5G performance requirements, meaning a substantial increase in integrated circuit cost. In addition to this increased cost, a larger number of bits being processed by the hardware logic would also lead to added challenges in timing closure in synthesis. Simply increasing word lengths is not a feasible solution to the problem at hand.

Another straightforward approach to solve this problem is to scale the signal to the desired/designed power level before it is processed by the hardware calculation blocks. This can be achieved with digital domain automatic gain control (AGC), and FIG. 2 does just that for the example MMSE receiver of FIG. 1 by addition of the AGC block 203 prior to the FFT block 104. Like-numbered processing blocks throughout FIGS. 2 and 5-7 are similar to those described for FIG. 1 except as noted.

Typically AGC measures signal power over time and then adjusts the gain based on the measurement. The selected gain must remain constant for the duration of a subframe, otherwise it causes distortion to the signal. In this approach to solving the low signal power problem it would be a natural choice to measure the signal level over one sub frame (or possibly even multiple subframes) and then adjust the gain. Such an AGC solution may be considered for implementation in 5G receivers but it has some inherent drawbacks.

Specifically, if the measurement window of the AGC is one subframe, the AGC will measure (for example, average or peak or similar) signal power across subframe N. The earliest moment when the gain can be adjusted is then at the beginning of subframe N+1. FIG. 3 illustrates this result: the scaler factor of the gain is measured at subframe N but cannot be applied any earlier than subframe N+1 meaning the gain is always based on previous data. It is inherent then that in the FIG. 2 AGC technique the scaling is inaccurate because it is based on the old data from subframe N where the power is measured, not on the current date in subframe N+1 where the gain computed from that measured power is actually applied. This leads to a still further problem; because scaling is not based on the current data, an additional margin must be set to avoid signal overflow. Signal overflow can occur when the power level of the incoming signal is rising (for example, higher signal power at the end of subframe N than at the beginning of subframe N). This additional margin means that the scaling applied to subframe N+1 will be below optimum, at least in some cases. Further, in practice it is very difficult to choose the correct margin.

Figure 2:
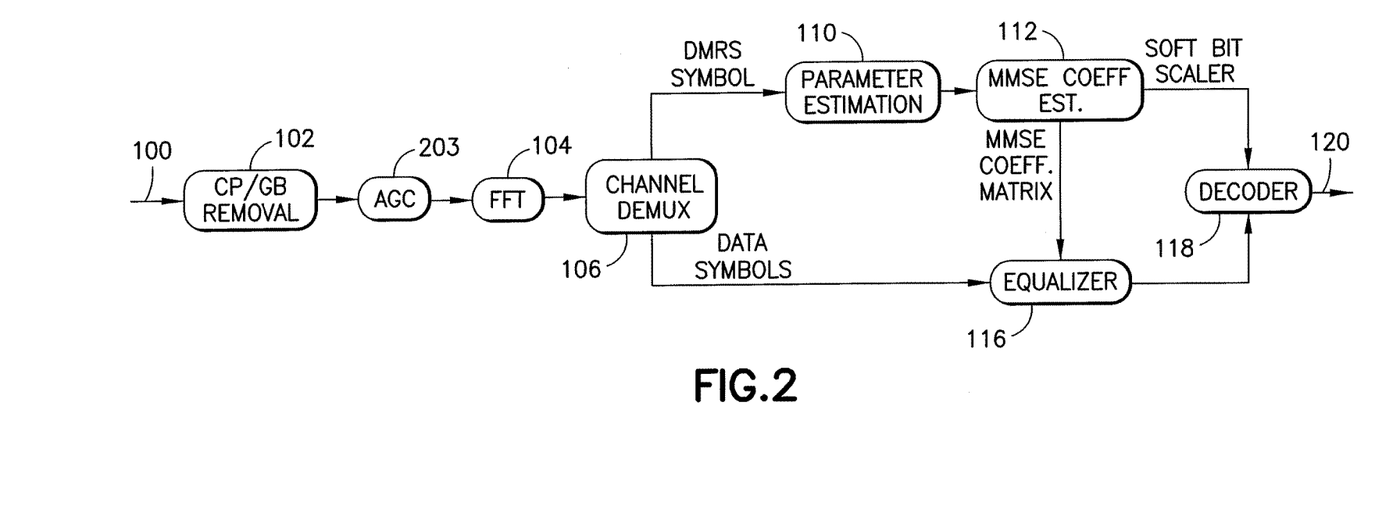
FIG. 2 is similar to FIG. 1 but with automatic gain control added to the start of the baseband processing chain.
Figure 3:
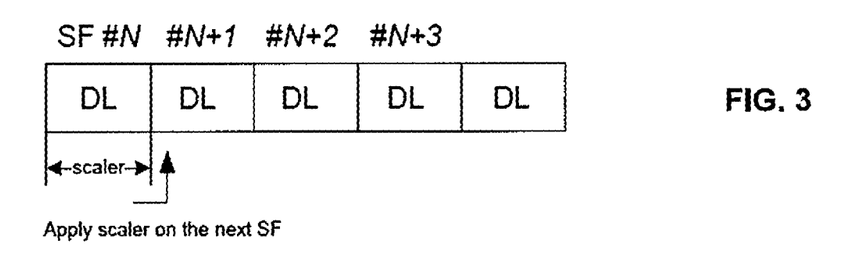
FIG. 3 illustrates multiple consecutive subframes in order of arrival (most recent is leftmost) and illustrates that for the FIG. 2 receiver the scaler computed from information in one subframe #N can only be applied to a next subsequent subframe #N+1.

To avoid these drawbacks of the FIG. 2 approach, a receiver can be designed to buffer a full subframe of data so that the gain computed from power measured at subframe N can be applied to that same subframe N after it is buffered. This added buffering would increase the receiver latency by one full subframe. Most high throughput wireless communication protocols set very tight latency requirements; for example the 5G cellular system now under development is to have a transmission time interval (TTI) of 0.2 ms. It is not clear how one can meet the strict latency requirements of 5G when this added buffering of an entire subframe would at minimum add an additional latency of 0.2 ms.

Recall that in the MMSE receiver of FIGS. 1-2 the channel parameter estimation block 110 and the MMSE equalization coefficient estimator block 112 operated only on the DMRS which was split from the remainder of the subframe by the channel demux block 106. Now consider FIG. 4 which looks inside a hypothetical 5G subframe of length 0.2 ms (5G is still under development and so the actual subframe may differ from that of FIG. 4). There is control data in the first two slots, a DMRS in the third slot, and user data in the remaining slots. In the FIG. 2 receiver the gain is applied to the entire subframe at the AGC block 203. But the problem with the low signal level occurs at the blocks that implement the channel estimation functions, namely the channel parameter estimation block 110 and the MMSE equalization coefficient estimator block 112. Performing gain correction/AGC based on all information in a given subframe as in FIG. 2 results in imperfect scaling because unrelated information is taken into account for the gain control. This is true even if, as mentioned above, one adds a full-subframe buffer to the FIG. 2 receiver so the gain can be applied to the same subframe in which signal power is measured.

The problem with the low signal level is most pronounced at the blocks 110, 112 that perform channel estimation and equalization coefficient calculation. But these blocks 110, 112 rely only on the DMRS of the sub frame. Applying a gain to only the DMRS can reduce inaccuracies in channel estimates that arise from signal power being too low and this approach can avoid many of the new problems added by the option shown at FIG. 2. Embodiments of these teachings apply AGC only to the DMRS symbol of a subframe that is used to estimate the channel rather than applying AGC to full signal/subframe.

Figure 4:
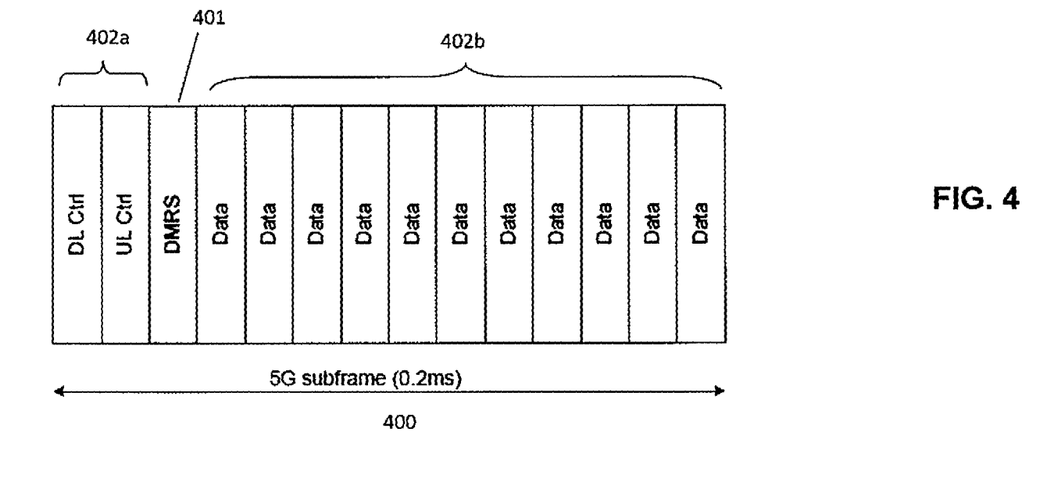
FIG. 4 is an illustration of one OFDMA subframe in the time domain and showing distinct symbols used for DMRS versus control information and user data.

If we consider the DMRS symbol as a first portion 401 of the FIG. 4 subframe 400 and the data symbols as a data portion 402b, then the gain is applied only to the first portion and not the data portion. A (different) gain may be applied later in the signal processing but prior to the decoding the gain applied to the first portion 401 that comprises/consists of the DMRS is not also applied to the data portion 402b that do not include any DMRS. In short, a portion 402b of the received signal is equalized using the equalization coefficients that are obtained from the DMRS after applying a gain to the first portion 401 that carries that DMRS. The control portion 402a of the subframe is typically treated separately from the data 402b and equalized with coefficients obtained from control channel reference signals; FIGS. 1-2 and 5-7 are simplified to better show the salient aspects of these teachings and do not specifically show processing of the received control symbols.

As will be detailed below, the equalization coefficients actually used for equalizing the remainder of the subframe are adjusted from those obtained from the channel estimates that arise from the gain-increased DMRS, in order to remove the effect adding that gain had on those equalization coefficients. For the case that each subframe 400 carrying a DMRS is processed in this manner at the receiver, each of these different subframes can be considered a different received signal.

Alternatively if there is only a DMRS in some but not all subframes, then what may be considered as the received signal is that group of subframes that will all be equalized using the same equalization coefficients/values. In this case the DMRS of that group of subframes would be the first portion 401 as in FIG. 4, and the data portion 402b of the received signal would be only the data symbols to which the equalization values obtained from the DMRS are applied. In this case of course the calculated gain would be applied in multiple subframes including subframes other than where signal power is measured, but if there is not a DMRS in every subframe that is an unavoidable result. The same technique can be used if individual symbols have a pilot sequence plus data, but not all symbols have a pilot sequence as detailed immediately below.

If instead the subframe structure is that pilots are present in the data symbols themselves as with the 4G/LTE radio access technology (different from a DMRS occupying an entire OFDM symbol position as FIG. 4 shows), the algorithm described herein can also be utilized by adapting from the described subframe basis to a symbol basis. In this case the pilot and the data portion come from the same symbol which would be considered the received signal that the algorithm operates upon, the gain would be calculated and applied per OFDM symbol and would not affect any adjacent symbols that have their own pilot for measuring and estimating the channel. In this regard the term reference signal can mean a DMRS (or any other type of pilot signal/sequence from which the channel is measured) that occupies an entire symbol position, or one or more pilot signals/sequences within a symbol that also carries data. Further, while FIG. 4 assumes OFDMA symbols this is only a specific example and not limiting to the broader teachings herein which may be utilized with other types of modulations and multiple access techniques.

The algorithms related to channel estimation and equalizer coefficient calculation are sensitive to problems from low signal power level and in the example OFDMA system these algorithms use DMRS as an input as opposed to all data in the subframe. Embodiments of these teachings scale only the problematic area. In the FIG. 4 example this is feasible due to the frame structure where DMRS is allocated to a separate symbol from those allocated for data 402b (and for control information 402a), and as detailed above it is also feasible for the case an individual symbol has a pilot and data together as the respective reference signal and data portions since like FIG. 4 that pilot can be treated separately from the data even if they are received in the same symbol.

Further for implementations specific to 5G and LTE, because 5G and LTE utilize orthogonal frequency division multiple access (OFMDA) technology, 5G and LTE receivers must perform a Fourier transform before the channel estimation is performed. As mentioned above it is common that this Fourier transform is implemented using a FFT algorithm, which has property of changing the sample order. More specifically, FFT operates in a bit-reversed order. Therefore the output of the FFT block must be buffered in order to correct the sample order. FIG. 5 shows a MMSE receiver with these added buffers; a DMRS buffer 510RS that re-orders the bit sequence of the reference signal and a data buffer 510D that re-orders the bit sequence of the data portion apart from the reference signal. Other receiver implementations may be somewhat different; FIG. 5 is depicted in this way to more closely track the MMSE receiver shown at FIG. 1.

Since the reference signal is fully buffered at 510RS before channel parameters are estimated at block 110 and the equalization coefficients are estimated at block 112, the signal level of the reference signal can be measured first and accurate scaling can be applied to the same reference signal that was measured, all without increasing latency in the signal processing.

It is important to match the DMRS scaling (gain) with data symbol scaling to avoid distortions when the channel estimates taken from the DMRS are applied to the data symbols. FIG. 6 is a block diagram similar to FIG. 2 that moves the location of the AGC function to facilitate this. The channel demultiplexer 106 splits the subframe 400 into the first portion 401 that carries the DMRS symbol and the data portion 402b that carries the data symbols. The AGC block 608A is disposed between that channel demultiplexer 106 and the channel parameter estimation block 110 so it operates only on the first portion 401 carrying the DMRS. There is also a cancellation block 608C disposed between the MMSE equalization coefficient estimator block 112 and the equalizer 116, with a communication link 608L between the AGC block 608A and the cancellation block 608C. Adding gain at the AGC block 608A to the DMRS has an effect on the values within the MMSE equalization coefficient matrix that are output from the MMSE coefficient estimator block 112. The AGC block 608A knows the amount of gain it applied and via the communication link 608L controls the cancellation block 608C to remove that effect on those equalization values. This reverses the scaling effect in the MMSE equalization coefficients, before they are applied to the data symbols in the equalizer 116 as FIG. 6 illustrates. In effect, the cancellation block 608C takes into account for the data symbols the fact that gain/scaling is applied by the AGC block 608A only to the DMRS.

Note that in the receivers shown at FIGS. 1-2 and 5-7 there are also soft bit/layer-wise SNR scalers output from the MMSE equalization coefficient estimator blocks. These are applied at the decoder as illustrated. These layer-wise SNR values are not adjusted further at FIG. 6 or 7 because these values do not require any correction due to applying gain only to the DMRS; they are used in the decoder 118 to calculate the least likelihood ratios.

It is known in the wireless arts how to calculate the MME equalization coefficient matrix from the channel estimates. As one non-limiting example, if the channel parameter matrix output from block 110 is $\hat{H}_s$, then the MMSE equalization coefficient matrix can be calculated as:

$$A_s = (\hat{H}_s^H \hat{H}_s + \sigma^2 I_A + C)^{-1} \hat{H}_s^H.$$

FIG. 7 is a more detailed view than FIG. 6 of how DMRS based AGC might be implemented in a MMSE receiver. The AGC block 608A is depicted in FIG. 7 as a gain block 714B (logical multiplier) and a measure block 714A. The buffers 710RS and 710D are as described above for the respective buffers 510RS and 510D of FIG. 5. The measure block 714A measures signal power of the first portion 401 of the received signal that is output from the channel demultiplexer 106; it may measure this signal power while the first portion 401/DMRS is in the DMRS buffer 710RS. The measure block 714A determines a gain needed to raise that first portion of the received signal to lie within the proper range for the receiver's design, and applies that gain at the multiplier/gain block 714B. In this case the measure block 714A can calculate a perfect scaler/gain for the DMRS symbol based on this measurement, and there is no need to account for a margin to avoid overshooting the receiver's designed limits for signal power level. The measure block 714A also provides to the cancellation block 714C a control signal or other information required to reverse the AGC effect on the calculated equalization values that define the MMSE coefficient matrix output from block 112.

Embodiments of these teachings provide several technical effects. First, a portion (DMRS) of the received signal can be measured first, and gain can be adjusted for the data in the same subframe (or same symbol for the case of symbol-basis embodiments) that was used for the measurement (instead of previous data as in FIG. 3). In this regard the scaling/gain is much more accurate, theoretically it can be perfect scaling. Above it was described that in the prior art a margin needed to be left when scaling data symbols in case there is a sudden change in signal levels, but in these embodiments there is no need to leave a scaling margin. Second, the channel estimation and coefficient calculation algorithms use only DMRS data for their calculations. Using all data in the AGC measurement as in FIG. 2 may result in imperfect scaling. Embodiments of these teachings measure signal level only on the DMRS instead of the full subframe. A third technical effect is that reference signal based AGC can be readily implemented also for utilization of pilot samples inside of a data symbol. In this regard the data symbol would be as the subframe of FIG. 4 with the pilot sample as the DMRS of FIG. 4. Pilot samples within a data symbol is a feature used on LTE and further being considered for future wireless radio protocols. A fourth technical effect is that these teaching of reference signal based AGC are readily adaptable for multiple users (for example multi-user multiple-input multiple-output MU-MIMO) where there would be individually tuned AGC gain scalers. This enables a more precise gain control in MU-MIMO where different users can experience different received signal power at different antennas, typically due in part to different channel conditions.

Figure 8:
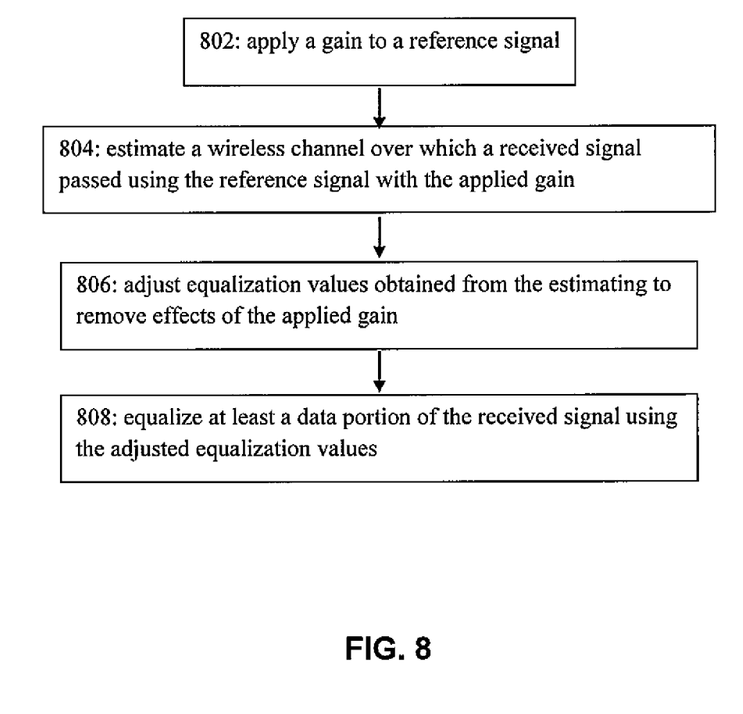
FIG. 8 is a process flow diagram summarizing certain of the above teachings from the perspective of the receiver.

FIG. 8 is a process flow diagram that summarizes some of the above aspects from the perspective of the receiver, which in a wireless system may be disposed on the network side such as in a base station (including relay stations and remote radio heads), eNB and/or access point as well as on the user side such as in a mobile smartphone or other type of user equipment (UE). At block 802 a gain is applied to a reference signal of a received signal, for example by the AGC block 608A of FIG. 6 or the multiplier 714B of FIG. 7. At block 804 a wireless channel over which a received signal passed is estimated using the reference signal with the applied gain. In the above description this was done by the channel parameter estimation block 110 and the MMSE equalization coefficient estimation block 112. The equalization values that are obtained from the estimating at block 804 are adjusted at block 806 to remove effects of the gain that was applied at block 802. This is performed in the above examples by the cancellation block 608C, 714C. And finally at block 808 at least a data portion of the received signal is equalized using the adjusted equalization values, described above for the equalizer 116 where the data symbols are equalized with the adjusted values of the MMSE equalization coefficient matrix. The results from the equalizer may be stored in a computer readable memory, such as for example a buffer within the decoder 118, or elsewhere in the receiver (not shown).

Various of the following aspects may be practiced individually with those shown at FIG. 8 or in any of various combinations. As described above the received signal may be considered to include a first portion comprising the reference signal and a second portion comprising at least the data portion; in those embodiments the gain that is applied at block 802 to the reference signal is not applied to the second portion that has the data, at least not prior to the equalizing. Where the output of the channel demultiplexer 106 is buffered as in the FIG. 6-7 examples the first portion on which the gain is applied can be in the same subframe or symbol with the data portion that is equalized with the adjusted equalization values, where the received signal of block 802 is a single subframe or a single symbol, respectively.

In the described but non-limiting examples the method shown at FIG. 8 is performed in a wireless radio receiver comprising a channel demultiplexer 106 that splits the received signal into a first portion 401 comprising the reference signal and the at least data portion 402b. More specifically, in those non-limiting examples the receiver is a minimum mean square error MMSE receiver, or a zero-forcing receiver, or any receiver characterized by successive interference cancellation (SIC). In the non-limiting examples above the reference signal of block 802 is a demodulation reference signal, and further to what FIG. 8 shows the data portion is decoded after being equalized. Also, those examples described an intermediate step between blocks 804 and 806 of FIG. 8, namely estimating the channel parameters from which the equalization values are calculated.

Embodiments of these teachings can also be as an apparatus comprising a splitter, a gain control circuit, an equalization values calculation circuit, a cancellation circuit and an equalizer. In this regard the splitter is in the position of the channel demultiplexer 106 and is configured to split a received signal into a first portion comprising a reference signal and a second portion. The gain control circuit is in the position of the AGC 608A or the combined measure 714A/multiplier 714B, and is configured to apply a gain to the reference signal. The channel estimating circuit is in the position of the parameter and MMSE coefficient estimator blocks 110, 112, and is configured to estimate a wireless channel over which the received signal passed using the reference signal with the applied gain. The cancellation circuit is in the position of the cancellation blocks 608C, 714C and is configured to adjust equalization values output from the equalization values estimating circuit so as to remove effects of the applied gain. Finally, the equalizer 116 is where the adjusted equalization coefficients are applied to the second portion.

Certain embodiments of these teachings may be implemented all in software, or in a combination of software and hardware, or entirely in hardware. Consider an all-software implementation with reference to FIGS. 6-7 where the hardware of the receiver is assumed to be as shown there. In this case the relevant embodiment may be a computer readable memory tangibly storing computer program instructions that, when executed by one or more processors, cause a radio receiver to at least apply a gain to a reference signal (shown at blocks 608A and combined blocks 714A/714B); then adjust equalization values to remove effects of the applied gain from estimating a wireless channel, over which a received signal passed, using the reference signal with the applied gain (the cancellation blocks 608C, 714C). This software only implementation would then input the adjusted equalization values to a processing block of the receiver (such as the equalizer 116) that also takes as input at least a data portion of the received signal.

The various processing blocks shown at least at FIGS. 6-7 may be considered to be circuitry, except the buffers 710RS and 710D may be considered to be memory or other such storage.

Figure 9:
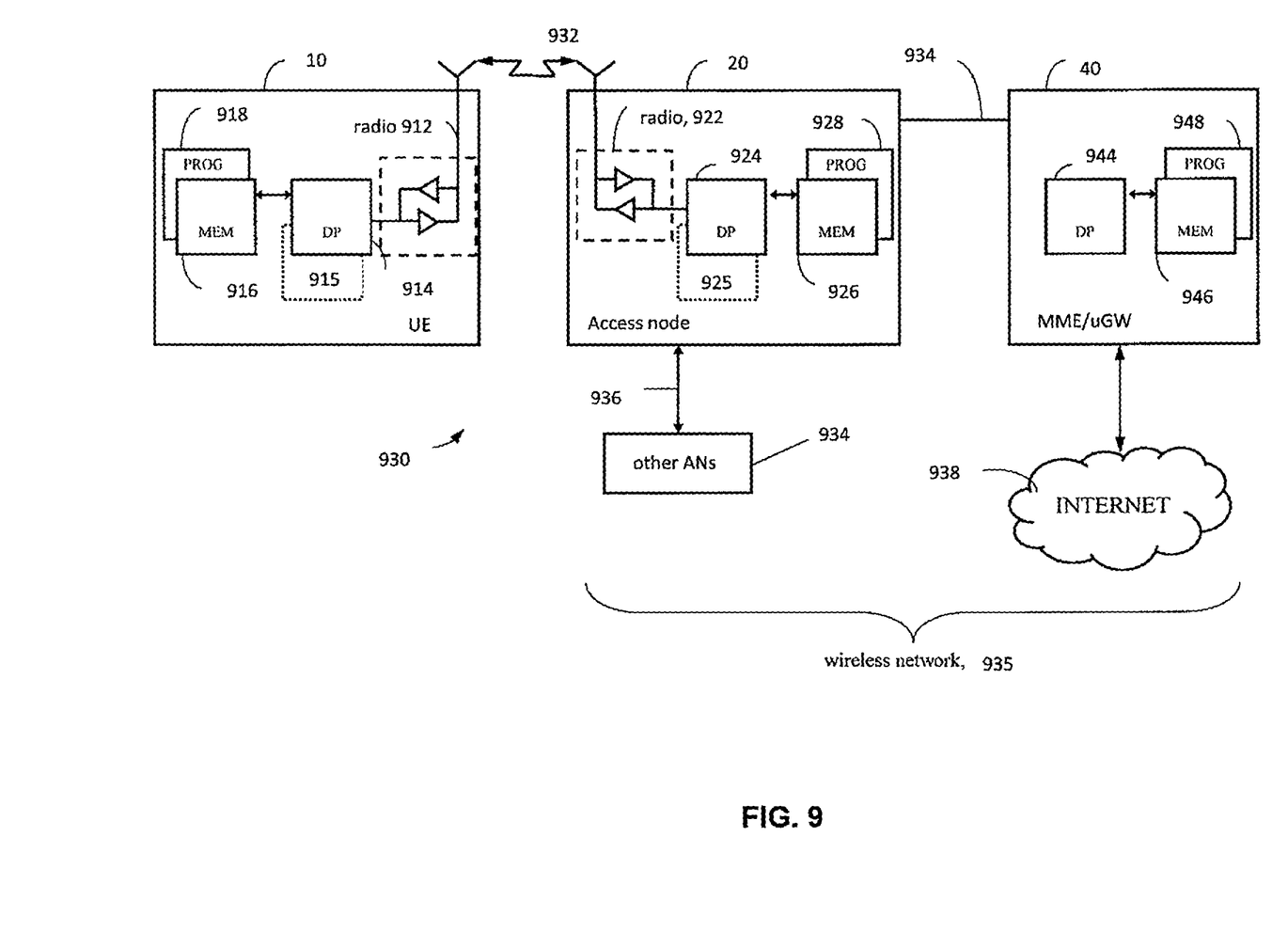
FIG. 9 is a high level schematic block diagram illustrating certain apparatus/devices that are suitable for practicing certain of these teachings.

FIG. 9 is a high level diagram illustrating some relevant components of various communication entities that may implement these teachings, including a base station identified generally as a radio network access node 20, a mobility management entity (MME) which may also be co-located with a user-plane gateway (uGW) 40, and a user equipment (UE) 10. In the wireless system 930 of FIG. 9 a communications network 935 is adapted for communication over a wireless link 932 with an apparatus, such as a mobile communication device which may be referred to as a UE 10, via a radio network access node 20. The network 935 may include a MME/Serving-GW 40 that provides connectivity with other and/or broader networks such as a publicly switched telephone network and/or a data communications network (e.g., the internet 938).

The UE 10 includes a controller, such as a computer or a data processor (DP) 914 (or multiple ones of them), a computer-readable memory medium embodied as a memory (MEM) 916 (or more generally a non-transitory program storage device) that stores a program of computer instructions (PROG) 918, and a suitable wireless interface, such as radio frequency (RF) transceiver or more generically a radio 912, for bidirectional wireless communications with the radio network access node 20 via one or more antennas. In general terms the UE 10 can be considered a machine that reads the MEM/non-transitory program storage device and that executes the computer program code or executable program of instructions stored thereon. While each entity of FIG. 9 is shown as having one MEM, in practice each may have multiple discrete memory devices and the relevant algorithm(s) and executable instructions/program code may be stored on one or across several such memories.

In general, the various embodiments of the UE 10 can include, but are not limited to, mobile user equipments or devices, cellular telephones, smartphones, wireless terminals, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The radio network access node 20 also includes a controller, such as a computer or a data processor (DP) 924 (or multiple ones of them), a computer-readable memory medium embodied as a memory (MEM) 926 that stores a program of computer instructions (PROG) 928, and a suitable wireless interface, such as a RF transceiver or radio 922, for communication with the UE 10 via one or more antennas. The radio network access node 20 is coupled via a data/control path 934 to the MME 40. The path 934 may be implemented as an S1 interface. The radio network access node 20 may also be coupled to other radio network access nodes via data/control path 636, which may be implemented as an X5 interface.

The MME 940 includes a controller, such as a computer or a data processor (DP) 944 (or multiple ones of them), a computer-readable memory medium embodied as a memory (MEM) 946 that stores a program of computer instructions (PROG) 948.

At least one of the PROGs 918, 928 is assumed to include program instructions that, when executed by the associated one or more DPs, enable the device to operate in accordance with exemplary embodiments of this invention. That is, various exemplary embodiments of this invention may be implemented at least in part by computer software executable by the DP 914 of the UE 10; and/or by the DP 924 of the radio network access node 20; and/or by hardware, or by a combination of software and hardware (and firmware). The MEMs that store the PROGs for implementing these teachings may be fully within the radios 912, 922 rather than separate as shown at FIG. 9; and for hardware or hardware+ software implementations at least the hardware portions may be found in a receiver portion of the illustrated radios 912, 922.

For the purposes of describing various exemplary embodiments in accordance with this invention the UE 10 and the radio network access node 20 may also include dedicated processors 915 and 925 respectively.

The computer readable MEMs 916, 926 and 946 may be of any memory device type suitable to the local technical environment and may be implemented using any suitable data storage technology, such as semiconductor based memory devices, flash memory, magnetic memory devices and systems, optical memory devices and systems, fixed memory and removable memory. The DPs 914, 924 and 944 may be of any type suitable to the local technical environment, and may include one or more of general purpose computers, special purpose computers, microprocessors, digital signal processors (DSPs) and processors based on a multicore processor architecture, as non-limiting examples. The wireless interfaces (e.g., radios 912 and 922) may be of any type suitable to the local technical environment and may be implemented using any suitable communication technology such as individual transmitters, receivers, transceivers or a combination of such components.

A computer readable medium may be a computer readable signal medium or a non-transitory computer readable storage medium/memory. A non-transitory computer readable storage medium/memory does not include propagating signals and may be, for example, but not limited to, an electronic, magnetic, optical, electromagnetic, infrared, or semiconductor system, apparatus, or device, or any suitable combination of the foregoing. Computer readable memory is non-transitory because propagating mediums such as carrier waves are memoryless. More specific examples (a non-exhaustive list) of the computer readable storage medium/ memory would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

A communications system and/or a network node/base station may comprise a network node or other network elements implemented as a server, host or node operationally coupled to a remote radio head. At least some core functions may be carried out as software run in a server (which could be in the cloud) and implemented with network node functionalities in a similar fashion as much as possible (taking latency restrictions into consideration). This is called network virtualization. "Distribution of work" may be based on a division of operations to those which can be run in the cloud, and those which have to be run in the proximity for the sake of latency requirements. In macro cell/small cell networks, the "distribution of work" may also differ between a macro cell node and small cell nodes. Network virtualization may comprise the process of combining hardware and software network resources and network functionality into a single, software-based administrative entity, a virtual network. Network virtualization may involve platform virtualization, often combined with resource virtualization. Network virtualization may be categorized as either external, combining many networks, or parts of networks, into a virtual unit, or internal, providing network-like functionality to the software containers on a single system.

The following abbreviations that may be found in the specification and/or the drawing figures are defined as follows:

4G/5G $4^{th}/5^{th}$ generation mobile telecommunication system
AGC automatic gain control
DMRS demodulation reference signal
FFT fast Fourier transform
LTE long term evolution (of E-UTRAN)
MMSE minimum mean square error
MU-MIMO multi user multiple-input-multiple-output
OFDMA orthogonal frequency-division multiple access

What is claimed is:
1. A method comprising:
applying a gain to a reference signal, wherein the reference signal is a demodulation reference signal;
estimating a wireless channel, over which a received signal passed, using the reference signal with the applied gain;

adjusting equalization values obtained from the estimating to remove effects of the applied gain; and equalizing at least a data portion of the received signal using the adjusted equalization values and storing the result in a computer readable memory, wherein at least prior to the equalization the gain is not applied to any of the at least data portion.

2. The method according to claim 1, wherein the received signal comprises a first portion comprising the reference signal and the at least data portion.

3. The method according to claim 2, wherein the first portion and the at least data portion are portions of a same subframe when the received signal is a single subframe or of a same symbol where the received signal is a single symbol.

4. The method according to claim 1, wherein the method is performed in a wireless radio receiver comprising a channel demultiplexer that splits the received signal into a first portion comprising the reference signal and the at least data portion.

5. The method according to claim 4, wherein the wireless radio receiver is a minimum mean square error (MMSE) receiver, a zero-forcing receiver, or a receiver characterized by successive interference cancellation.

6. The method according to claim 1, wherein the received signal comprises a first portion comprising the reference signal and the at least data portion; and the method further comprises: decoding the at least data portion after the equalizing.

7. The method according to claim 1, wherein the wireless channel is estimated via channel parameters and the equalization values are equalization coefficients calculated using the channel parameters.

8. An apparatus comprising:
a splitter configured to split a received signal into a first portion comprising a reference signal and a data portion, wherein the reference signal is a demodulation reference signal;
a gain control circuit configured to apply a gain to the reference signal;
a channel estimating circuit configured to estimate a wireless channel, over which the received signal passed, using the reference signal with the applied gain;
an equalization values calculation circuit configured to calculate equalization values from the estimated wireless channel;
a cancellation circuit configured to adjust the calculated equalization values output from the equalization values calculation circuit so as to remove effects of the applied gain; and an equalizer at which the adjusted equalization values are applied to the data portion, wherein at least prior to the equalization the gain is not applied to any of the at least data portion.

9. The apparatus according to claim 8, wherein the splitter is a channel demultiplexer that operates to channel demultiplex the received signal.

10. The apparatus according to claim 8, wherein the first portion and the data portion are portions of a same subframe or of a same symbol.

11. The apparatus according to claim 8, wherein the apparatus comprises a wireless radio receiver, and the splitter splits the received signal into a first portion comprising the reference signal and a second portion that comprises a remainder of the received signal.

12. The apparatus according to claim 11, wherein the wireless radio receiver is a minimum mean square error (MMSE) receiver, a zero-forcing receiver, or a receiver characterized by successive interference cancellation.

13. The apparatus according to claim 8, further comprising: a decoder configured to decode the data portion after being equalized at the equalizer.

14. A computer readable memory tangibly storing computer program instructions that, when executed by one or more processors, cause a radio receiver to at least:
apply a gain to a reference signal, wherein the reference signal is a demodulation reference signal;
estimate a wireless channel, over which a received signal passed, using the reference signal with the applied gain;
adjust equalization values obtained from the estimating to remove effects of the applied gain; and
equalize at least a data portion of the received signal using the adjusted equalization values, wherein at least prior to the equalization the gain is not applied to any of the at least data portion.

15. The computer readable memory according to claim 14, wherein the receiver comprises channel demultiplexing circuitry and equalization values calculation circuitry, and the gain is applied to the reference signal after passing through the channel demultiplexing circuitry and prior to passing into the equalization values calculation circuitry.

16. The computer readable memory according to claim 14, wherein the reference signal and the data portion are in a same subframe or in a same symbol.

17. The computer readable memory according to claim 14, wherein the radio receiver is a minimum mean square error (MMSE) receiver, a zero-forcing receiver, or a receiver characterized by successive interference cancellation.

* * * * *